(12) United States Patent
Meiser et al.

(10) Patent No.: US 9,356,148 B2
(45) Date of Patent: May 31, 2016

(54) FIN-TYPE SEMICONDUCTOR DEVICE AND MANUFACTURING METHOD

(71) Applicant: Infineon Technologies Austria AG, Villach (AT)

(72) Inventors: Andreas Meiser, Sauerlach (DE); Christian Kampen, Munich (DE)

(73) Assignee: Infineon Technologies Austria AG, Villach (AT)

( * ) Notice: Subject to any disclaimer, the term of this patent is extended or adjusted under 35 U.S.C. 154(b) by 0 days.

(21) Appl. No.: 14/641,896

(22) Filed: Mar. 9, 2015

(65) Prior Publication Data

US 2015/0206975 A1 Jul. 23, 2015

Related U.S. Application Data

(63) Continuation of application No. 13/692,462, filed on Dec. 3, 2012, now Pat. No. 9,006,811.

(51) Int. Cl.
| | |
|---|---|
| *H01L 27/12* | (2006.01) |
| *H01L 29/78* | (2006.01) |
| *H01L 29/66* | (2006.01) |
| *H01L 21/225* | (2006.01) |
| *H01L 29/06* | (2006.01) |

(52) U.S. Cl.
CPC .......... *H01L 29/7851* (2013.01); *H01L 21/225* (2013.01); *H01L 29/0653* (2013.01); *H01L 29/66575* (2013.01); *H01L 29/66795* (2013.01); *H01L 29/785* (2013.01); *H01L 29/7833* (2013.01)

(58) Field of Classification Search
CPC .......................... H01L 29/66795; H01L 29/785
USPC ................................................... 257/343–347
See application file for complete search history.

(56) References Cited

U.S. PATENT DOCUMENTS

| | | | | |
|---|---|---|---|---|
| 6,121,661 | A * | 9/2000 | Assaderaghi et al. | 257/355 |
| 2001/0040273 | A1* | 11/2001 | Hueting et al. | 257/623 |
| 2007/0026615 | A1 | 2/2007 | Goktepeli et al. | |
| 2008/0113476 | A1* | 5/2008 | Anderson et al. | 438/198 |
| 2008/0246086 | A1 | 10/2008 | Korec et al. | |
| 2009/0273029 | A1 | 11/2009 | Tien et al. | |
| 2010/0096697 | A1 | 4/2010 | Su et al. | |
| 2010/0219471 | A1 | 9/2010 | Cai | |
| 2010/0237416 | A1 | 9/2010 | Hebert | |
| 2011/0210395 | A1* | 9/2011 | Orlowski et al. | 257/347 |
| 2012/0193707 | A1* | 8/2012 | Huang et al. | 257/335 |
| 2014/0008733 | A1 | 1/2014 | Shrivastava et al. | |

FOREIGN PATENT DOCUMENTS

KR 100696197 B1 3/2007

\* cited by examiner

*Primary Examiner* — Mohsen Ahmadi
*Assistant Examiner* — Frederick B Hargrove
(74) *Attorney, Agent, or Firm* — Murphy, Bilak & Homiller, PLLC

(57) ABSTRACT

One embodiment of a semiconductor device includes a fin at a first side of a semiconductor body, a body region of a second conductivity type in at least a part of the fin, a drain extension region of a first conductivity type, a source region and a drain region of the first conductivity type, a source contact in contact with the source region, the source contact extending along a vertical direction along the source region, and a gate structure adjoining opposing walls of the fin. The body region and the drain extension region are arranged one after another between the source region and the drain region.

17 Claims, 14 Drawing Sheets

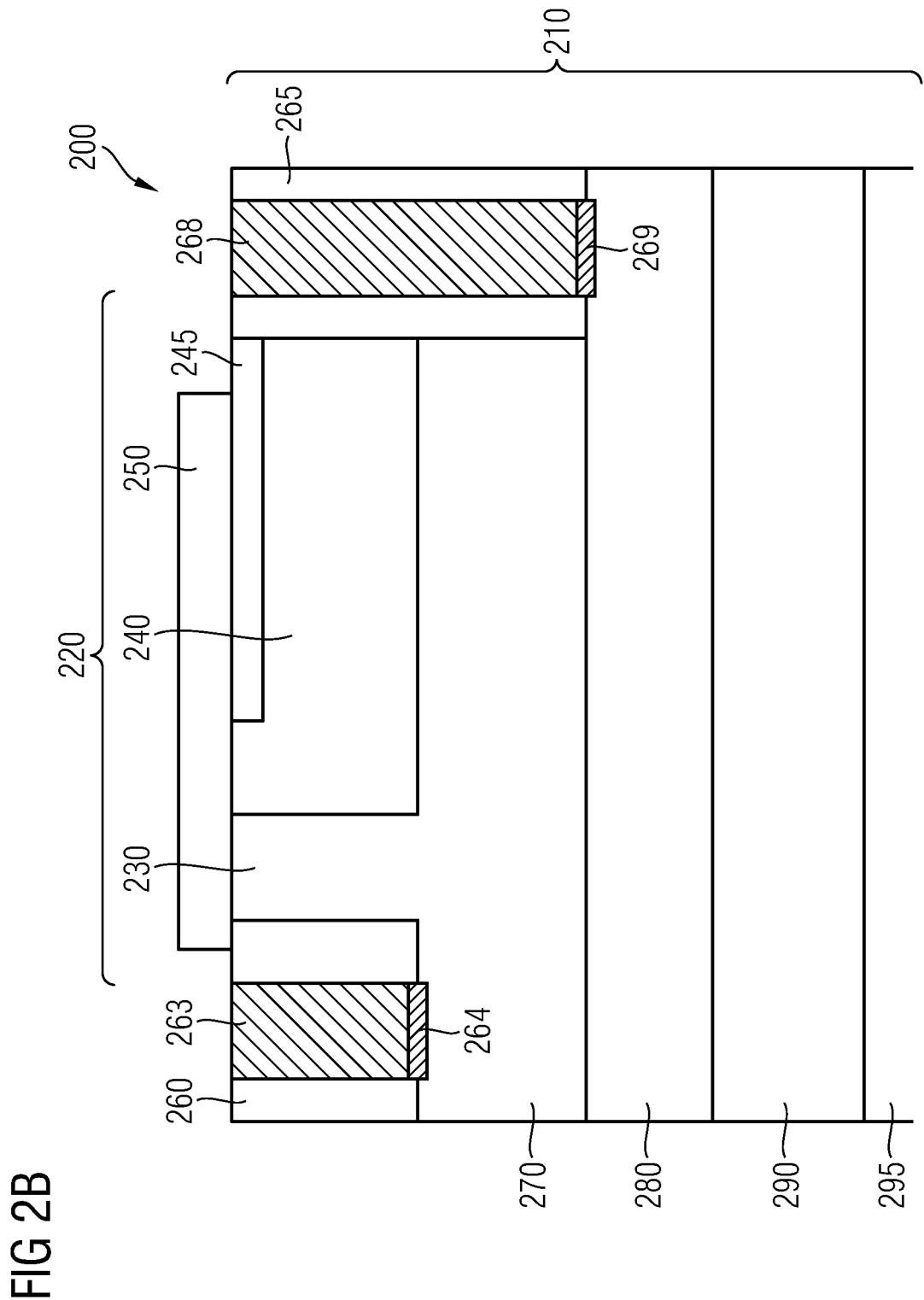

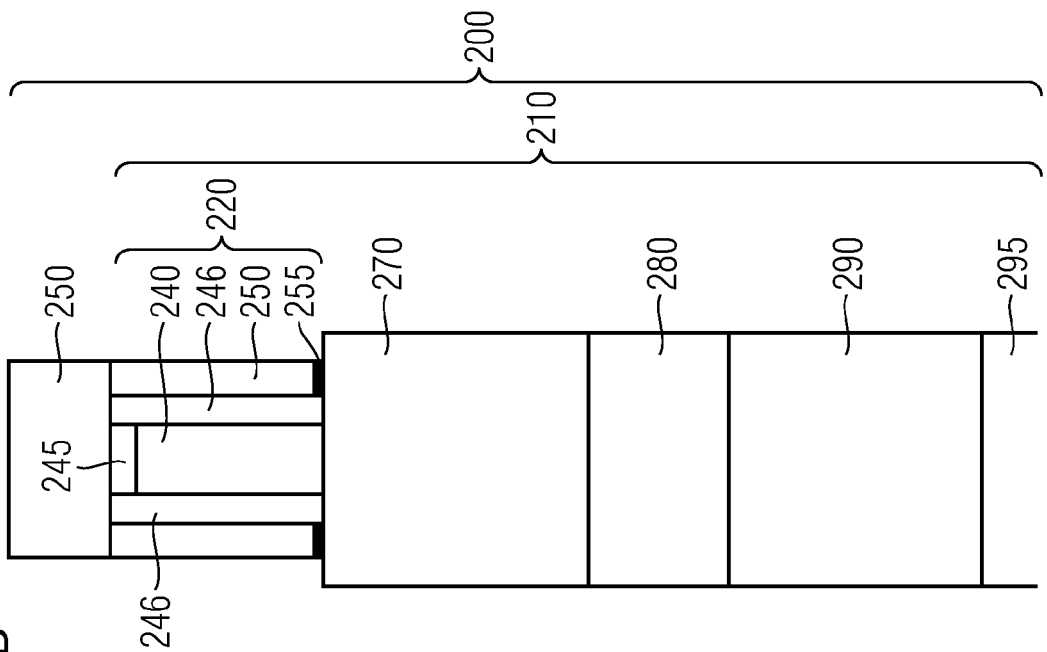
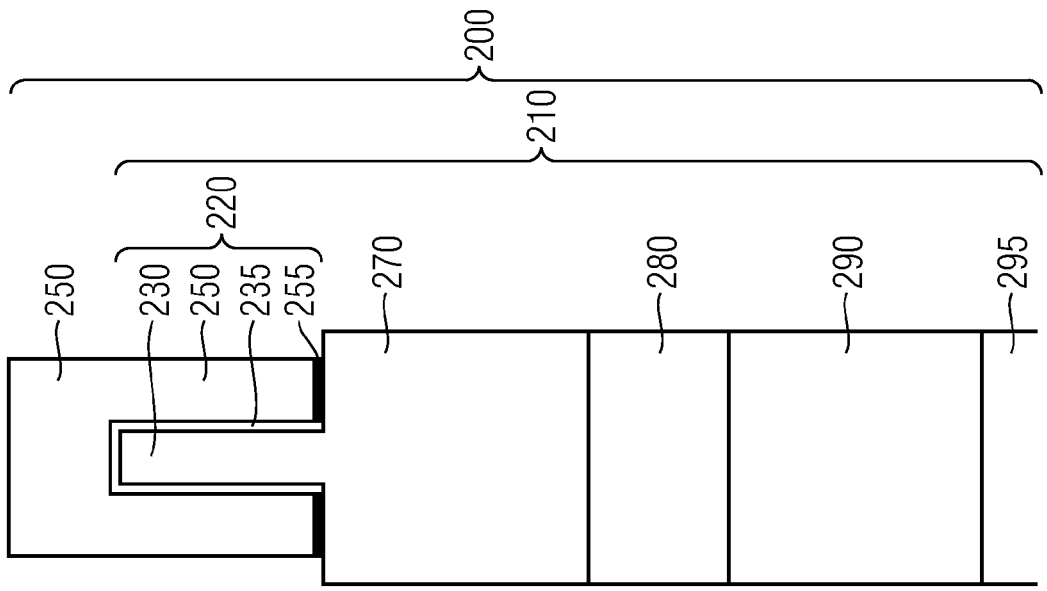

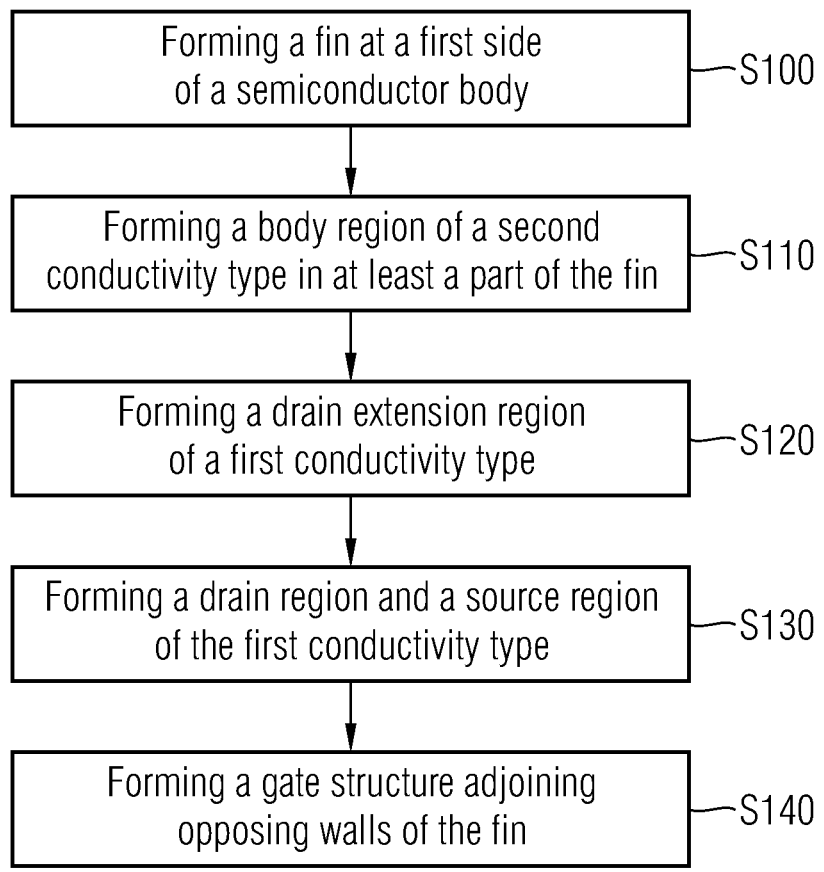
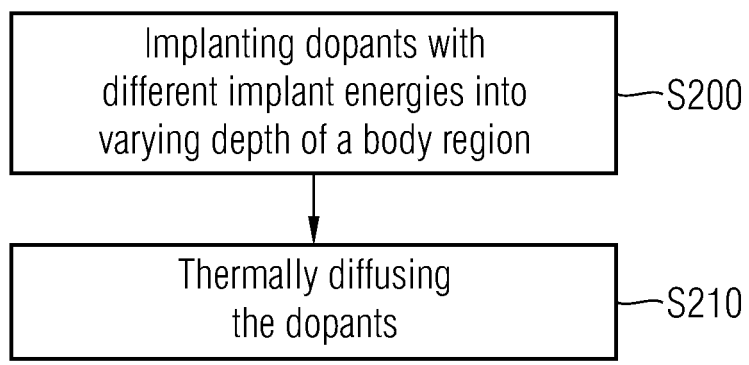

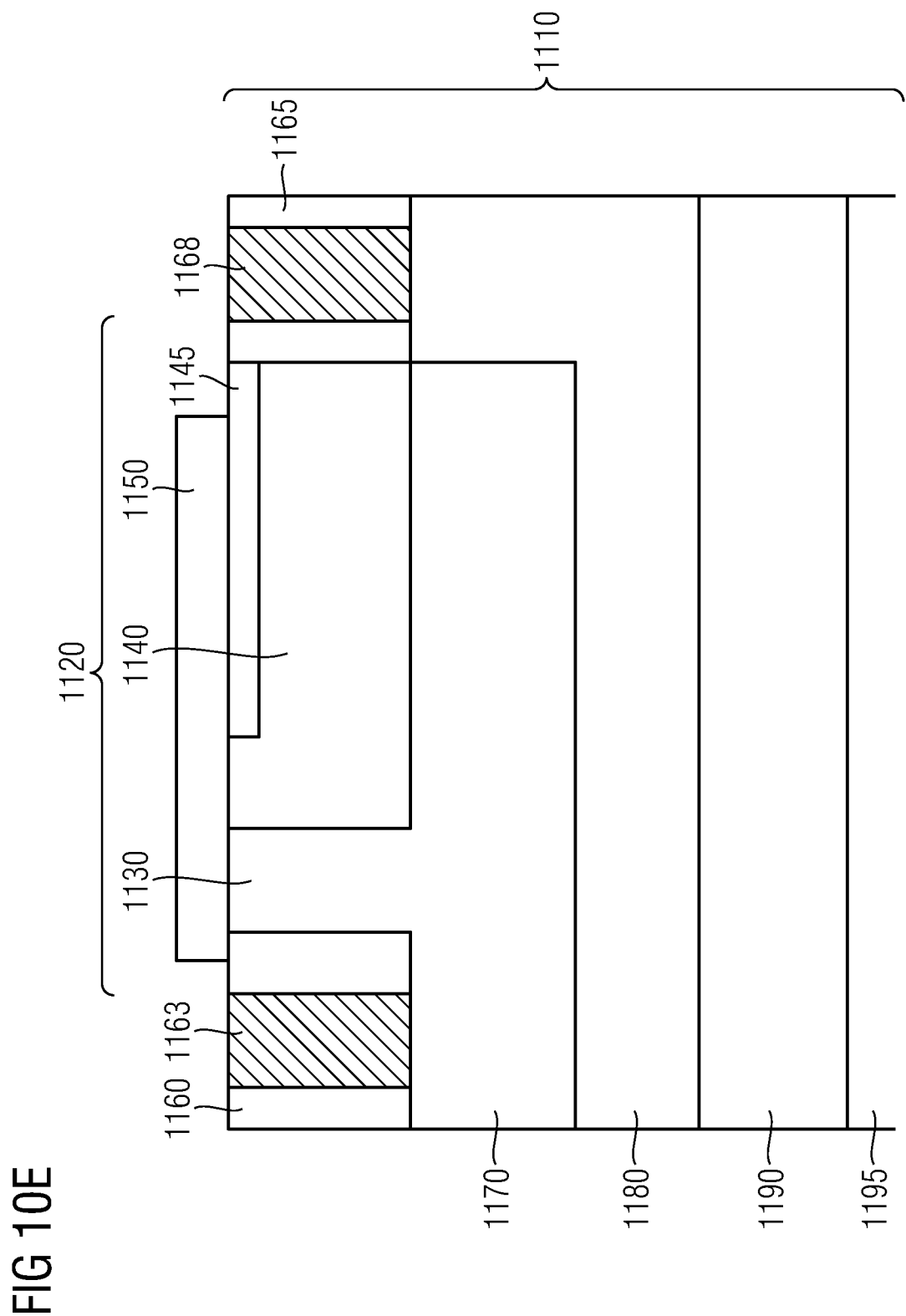

US 9,356,148 B2

FIN-TYPE SEMICONDUCTOR DEVICE AND MANUFACTURING METHOD

BACKGROUND

One goal in the development of power transistor devices as used e.g. in automotive and industrial applications is to provide a high blocking voltage and a low on-state resistance. Lateral transistor structures have the advantage that the blocking voltage can be adjusted by scaling of a drift region. It is desirable to develop design concepts providing a high blocking voltage and a low on-state resistance.

SUMMARY

According to an embodiment, a semiconductor device includes a fin on a first side of a semiconductor body. The semiconductor device further includes a body region of a second conductivity type in at least a part of the fin. The semiconductor device further includes a drain extension region of a first conductivity type, a source and a drain region of the first conductivity type, and a gate structure adjoining opposing walls of the fin. The body region and the drain extension region are arranged one after another between the source and the drain region.

According to another embodiment a method of manufacturing an embodiment of a semiconductor device is provided. The method includes forming a fin on a first side of a semiconductor body. Within at least a part of the fin a body region of a second conductivity type is formed. The method further includes forming of a drain extension region of a first conductivity type, forming of a source and a drain region of the first conductivity type, and forming of a gate structure adjoining opposing walls of the fin. The body region and the drain extension region are arranged one after another between the source and the drain region.

Those skilled in the art will recognize additional features and advantages upon reading the following detailed description, and upon viewing the accompanying drawings.

BRIEF DESCRIPTION OF THE DRAWINGS

The accompanying drawings are included to provide a further understanding of the present invention and are incorporated in and constitute a part of the specification. The drawings illustrate embodiments of the present invention and together with the description serve to explain principles of the invention. Other embodiments of the invention and many of the intended advantages will be readily appreciated as they become better understood by reference to the following detailed description. The elements of the drawings are not necessarily to scale relative to each other. Like reference numerals designate corresponding similar parts.

FIGS. 2A to 2D illustrate different views of one embodiment of a semiconductor device including a fin and a drain extension region, wherein a deep body region acts as a charge compensation region.

FIG. 7 illustrates one embodiment of a process flow of manufacturing a semiconductor device including a fin and a drain extension region.

FIG. 8 illustrates one embodiment of a process flow of manufacturing a body region of a semiconductor device including a fin and a drain extension region.

FIGS. 10A to 10E illustrate cross-sectional and three-dimensional views of one embodiment of a method of manufacturing a semiconductor device including a fin and a drain extension region.

DETAILED DESCRIPTION

In the following detailed description, reference is made to the accompanying drawings, which form a part hereof, and in which are shown by way of illustrations specific embodiments in which the invention may be practiced. It is to be understood that other embodiments may be utilized and structural and logical changes may be made without departing from the scope of the present invention. For example features illustrated or described for one embodiment can be used on or in conjunction with other embodiments to yield yet a further embodiment. It is intended that the present invention include such modifications and variations. The examples are described using specific language, which should not be construed as limiting the scope of the appending claims. The drawings are not scaled and for illustrative purpose only. For clarity, corresponding elements have been designated by the same references in the different drawings if not stated otherwise.

The terms "having", "containing", "including", "comprising" and the like are open and the terms indicate the presence of stated structures, elements or features but not preclude additional elements or features.

The terms "one after another", "successively" and the like indicate a loose ordering of elements not precluding additional elements placed in between the ordered elements.

The articles "a", "an", and "the" are intended to include the plural as well as the singular, unless the context clearly indicates otherwise.

In this specification, p-type or p-doped may refer to a first conductivity type while n-type or n-doped is referred to a second conductivity type. Semiconductor devices can be formed with opposite doping relations so that the first conductivity type can be p-doped and the second conductivity type can be n-doped. Furthermore, some figures illustrate relative doping concentrations by indicating "−" or "+" next to the doping type. For example, "n$^-$" means a doping concentration less than the doping concentration of an "n"-doping region while an "n$^+$"-doping region has a larger doping concentration than the "n"-doping region. Indicating the relative doping concentration does not, however, mean that doping regions of the same relative doping concentration have the same absolute doping concentration unless otherwise stated. For example, two different n+ regions can have different absolute doping concentrations. The same applies, for example, to an $n^+$ and a $p^+$ region.

The first conductivity type may be n- or p-type provided that the second conductivity type is complementary.

The term "electrically connected" describes a permanent low-ohmic connection between electrically connected elements, for example a direct contact between the concerned elements or a low-ohmic connection via a metal and/or highly doped semiconductor.

It is to be understood that the features of the various embodiments described herein may be combined with each other, unless specifically noted otherwise.

Figure 1:
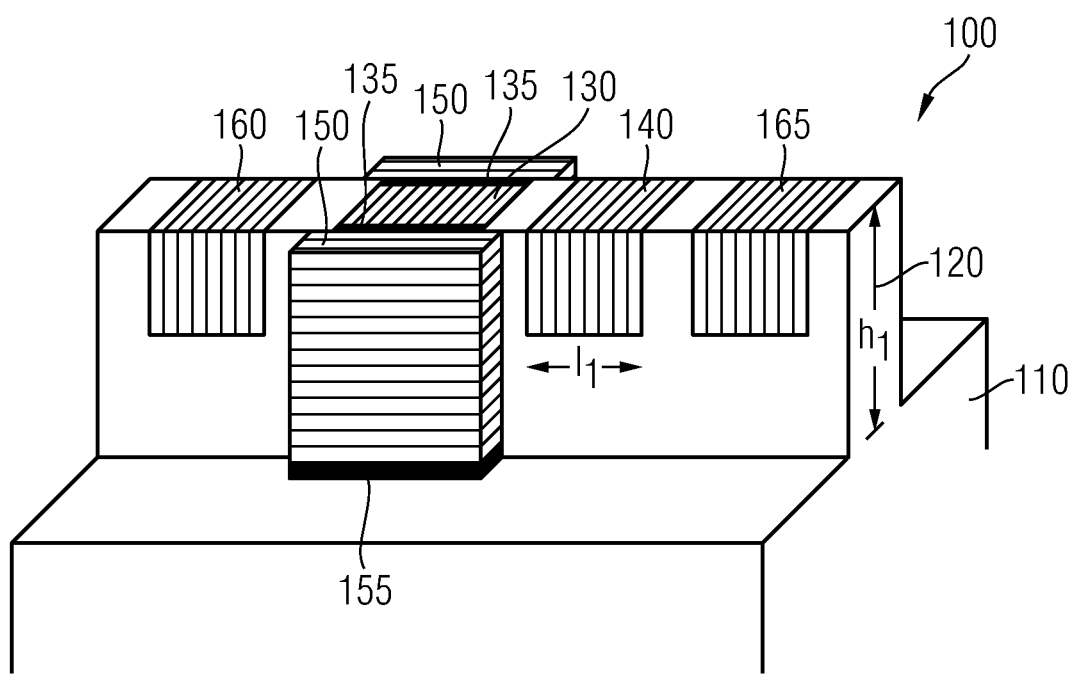
FIG. 1 illustrates one embodiment of a semiconductor device including a fin and a drain extension region.

FIG. 1 illustrates a perspective view of a first embodiment of a semiconductor device 100. The semiconductor device 100 includes a fin 120 of a height h1 located at a first side of a semiconductor body 110. The fin 120 may be a part of the semiconductor body 110 formed by e.g. etching recesses into the semiconductor body 110. A part of the fin 120 includes a body region 130 of a second conductivity type. The body region 130 and a drain extension region 140 of a first conductivity type are arranged one after another between a source region 160 of the first conductivity type and a drain region 165 of the first conductivity type. The source region 160, the body region 130, the drain extension region 140, and the drain region 165 may adjoin each other, but optional further semiconductor regions may be arranged between any of these regions.

An average doping concentration of the drain extension region 140 is lower than the doping concentration of the drain region 165. According to one embodiment, the drain extension region 140 and the drain region 165 include different dopants, e.g. different elements or compounds. In one embodiment the doping concentration of the drain extension region 140 is less than $10^{18}$ cm$^{-3}$ and the doping concentration of each one of the source region 160 and the drain region 165 is at least $10^{19}$ cm$^{-3}$. According to one embodiment, the doping concentration of the body region ranges between $10^{16}$ cm$^{-3}$ and $10^{19}$ cm$^{-3}$.

A gate structure 150 adjoins opposing walls of the fin 120. The gate structure 150 may include a gate electrode material, e.g. one or a combination of a metal, a metal compound, a highly doped semiconductor material such as highly doped polysilicon. The gate structure 150 further includes a gate dielectric, e.g. $SiO_2$. According to another embodiment, the gate structure 150 includes a metal adjoining an undoped or lightly doped part of the fin 120. In this case, a threshold voltage is defined by a contact barrier between the undoped or lightly doped part of the fin 120 such as an undoped or lightly doped body region 130, and the metal. The gate structure 150 adjoins a channel region 135 of the first conductivity type inside the body region 130. According to one embodiment the gate dielectric adjoins the channel region 135 and insulates the channel region 135 from the gate electrode. According to another embodiment a metal or metal compound of the gate structure 150 adjoins the channel region 135 and forms a Schottky-type junction. A conductivity in the channel region 135 can be controlled by applying a voltage to the gate structure 150. Thereby, current flow between the source region 160 and the drain region 165 can be controlled.

A bottom side of the gate structure 150 is electrically insulated from the semiconductor body 110 by a bottom dielectric 155. The bottom dielectric 155 has a sufficient thickness to ensure a desired degree of electric isolation of the gate structure 150 and the semiconductor body 110 at the bottom side of the gate structure 150. According to one embodiment, a thickness of the bottom dielectric 155 is greater than a thickness of a gate dielectric of the gate structure 150.

Increasing the height h1 of the fin 120 will also increase the area of the channel region 135 and will result in a reduction of the on-state resistance of the semiconductor device 100. In one embodiment, the height h1 of the fin 120 ranges between 0.5 µm and 20 µm.

The drain extension region 140 can absorb reverse voltages applied between the source region 160 and the drain region 165 up to a voltage blocking capability of the semiconductor device 100. A value of the breakdown voltage of the semiconductor device 100 depends on a lateral extension and a doping concentration of the drain extension region 140. Therefore, the length of the drain extension region 140 can be used to adjust the breakdown voltage of the semiconductor device 100. In one embodiment, the length l1 of the drain extension region 140 ranges between 0.5 µm and 100 µm.

The semiconductor device 100 enables a high blocking voltage and a low switch-on resistance together with a minimization of the device area by forming channel regions 135 at walls of the fin 120 together with an arrangement of a drain extension region between the channel region 135 and the drain region 165.

Figure 2A:
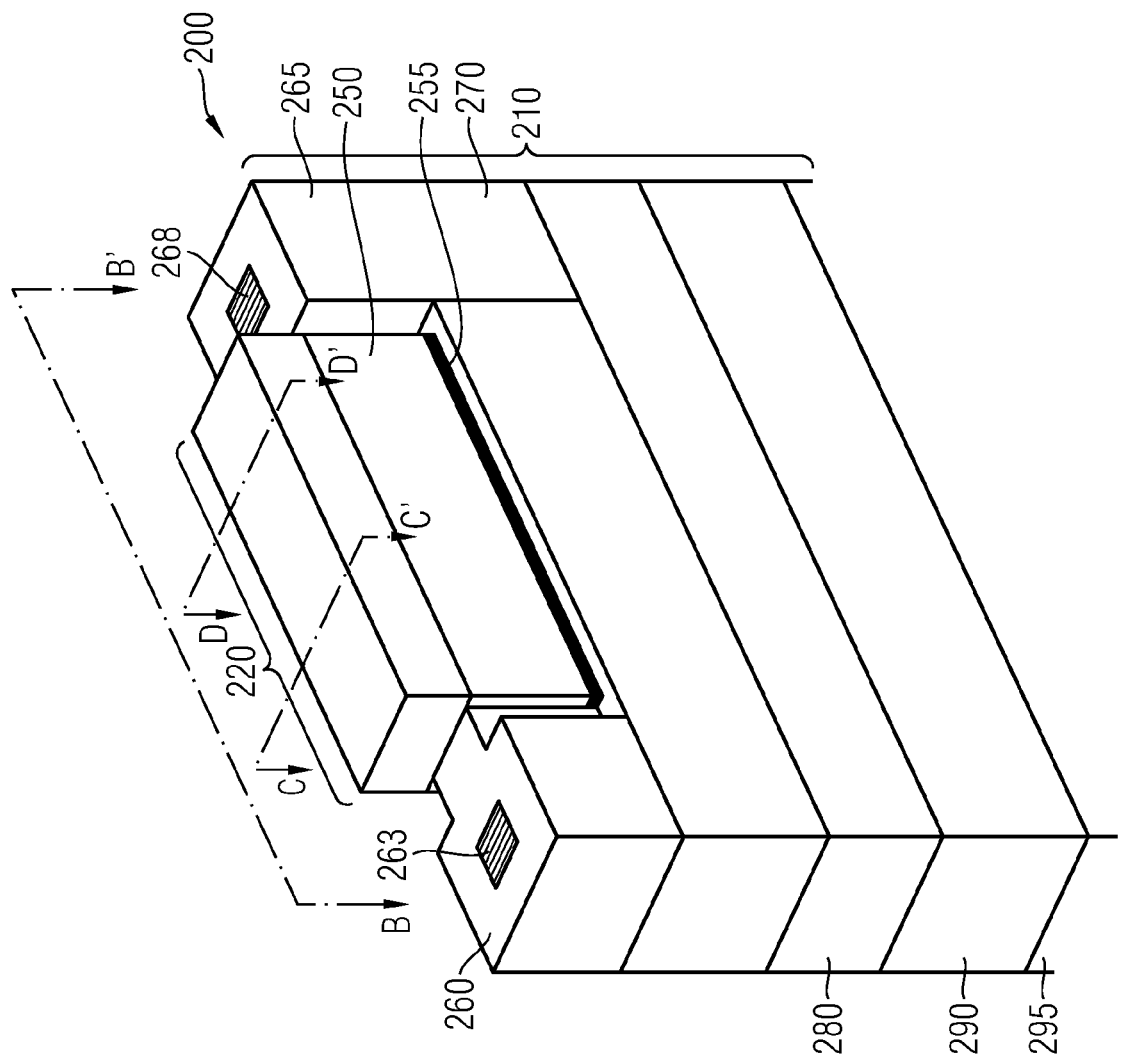

Referring to FIGS. 2A to 2D, one embodiment of a semiconductor device 200 is illustrated at different views. In some of these views, elements may visible and denoted by a symbol, whereas the same elements may be invisible at other views. Thus, FIGS. 2A to 2D are to be observed together. FIG. 2A illustrates a perspective view of the semiconductor device 200. FIG. 2B illustrates a cross-sectional view along a section BB' of FIG. 2A, FIG. 2C illustrates a cross-sectional view along a section CC' of FIG. 2A, and FIG. 2D illustrates a cross-sectional view along a section DD' of FIG. 2A.

The semiconductor device 200 includes a fin 220 located at a first side of a semiconductor body 210. The semiconductor body 210 includes a deep body region 270 of the second conductivity type, a semiconductor layer 280, e.g. an epitaxial semiconductor layer of the first or the second conductivity type, a buried layer 290 of the first or the second conductivity type, and a semiconductor substrate 295.

The buried layer 290 may be highly doped enabling a suppression or degradation of a vertical bipolar transistor injecting charge carriers into the semiconductor substrate 295. The buried layer 290 may include a higher doping concentration than the semiconductor layer 280. In one embodiment, the semiconductor substrate 295 is n-doped and the buried layer 290 is $p^+$-doped. In another embodiment, the semiconductor substrate 295 is p-doped and the buried layer 290 is $n^+$-doped. According to another embodiment, the semiconductor substrate 295 is part of a silicon-on-insulator (SOI) substrate. According to yet another embodiment, the semiconductor substrate 295 and the buried layer 290 are combined in a highly doped semiconductor substrate.

In the embodiment illustrated in FIGS. 2A to 2D, the fin 220 includes a body region 230 of the second conductivity type, a channel region 235, a drain extension region 240 of the first conductivity type, and a shallow trench isolation (STI) 245 adjoining a top face of the drain extension region 240. An insulating layer 246 having a thickness greater than a gate dielectric of a gate structure 250 adjoins the fin 220 at opposing walls in an area of the drain extension region 240 (cf. FIG. 2D). The gate structure 250 adjoins the fin 220 at two opposing walls and on a top face in an area of the channel region 235 (cf. FIG. 2C). The arrangement of the shallow trench isolation 245 and the gate structure 250 on the drain extension region 240 enables a higher doping in the drain extension region 240 due to a high electric field punch through. This enables a further reduction of the on-state resistance. The gate structure 250 on the top face of the fin 220 may also be absent. The gate structure 250 is electrically isolated from the deep body region 270 by a bottom dielectric 255.

At its two ends, the fin 220 adjoins a source region 260 of the first conductivity type and a drain region 265 of the first conductivity type. The source region 260 is electrically connected to a source contact 263, e.g. a highly doped polysilicon and/or metal source contact extending into the semiconductor body 210. The drain region 265 is electrically connected to a drain contact 268, e.g. a highly doped polysilicon and/or metal drain contact.

One or both of the source region 260 and the drain region 265 may extend as deep into the semiconductor body 210 as the drain extension region 240 or end in the deep body region 270.

One of the source and drain regions 260, 265 may also extend deeper into the semiconductor body 210. According to one embodiment, the one of the source and drain regions 260, 265 may end at a top face or extend into one of the semiconductor layer 280, the buried layer 290 and the semiconductor substrate 295.

As is illustrated in FIG. 2B the drain contact 268 extends through the drain region 265 and ends at the semiconductor layer 280. An optional highly doped first contact layer 269 sharing a conductivity type with the semiconductor layer 280 may be arranged between the semiconductor layer 280 and the drain contact 268 for reducing a contact resistance. Likewise, the source contact 263 extends through the source region 260 and ends at the deep body region 270. An optional highly doped second contact layer 264 sharing a conductivity type with the deep body region 270 may be arranged between the deep body region 270 and the source contact 263 for reducing a contact resistance.

The deep body region 270 is electrically connected to the body region 230 and extends below the drain extension region 240 along a lateral direction. The deep body region 270 and the drain extension region 240 constitute a superjunction (SJ) structure. Charge compensation between the deep body region 270 and the drain extension region 240 enables a higher doping of the drain extension region 240 while maintaining the voltage blocking capabilities. Hence, the on-state resistance can be improved. When viewed from the first side of the semiconductor body 210, the drain extension region 240, the deep body region 270, the semiconductor layer 280, the buried layer 290, and the semiconductor substrate 295 are successively arranged. Further regions may be located between any of the drain extension region 240, the deep body region 270, the semiconductor layer 280, the buried layer 290, and the semiconductor substrate 295.

As regards details, e.g. materials, shapes of the gate structures 250, the bottom dielectric 255, the body region 230, the drain extension region 240, the source region 260, the drain region 265, and the fin 120, the information of the embodiment described with reference to FIG. 1 applies likewise.

In one embodiment a maximum doping concentration of the deep body region 270 ranges between $10^{16}$ cm$^{-3}$ and $10^{18}$ cm$^{-3}$, a maximum doping concentration of the semiconductor layer 280 ranges between $10^{15}$ cm$^{-3}$ and $10^{18}$ cm$^{-3}$, and a maximum doping concentration of the buried layer 290 ranges between $10^{17}$ cm$^{-3}$ and $10^{21}$ cm$^{-3}$.

Figure 3A:
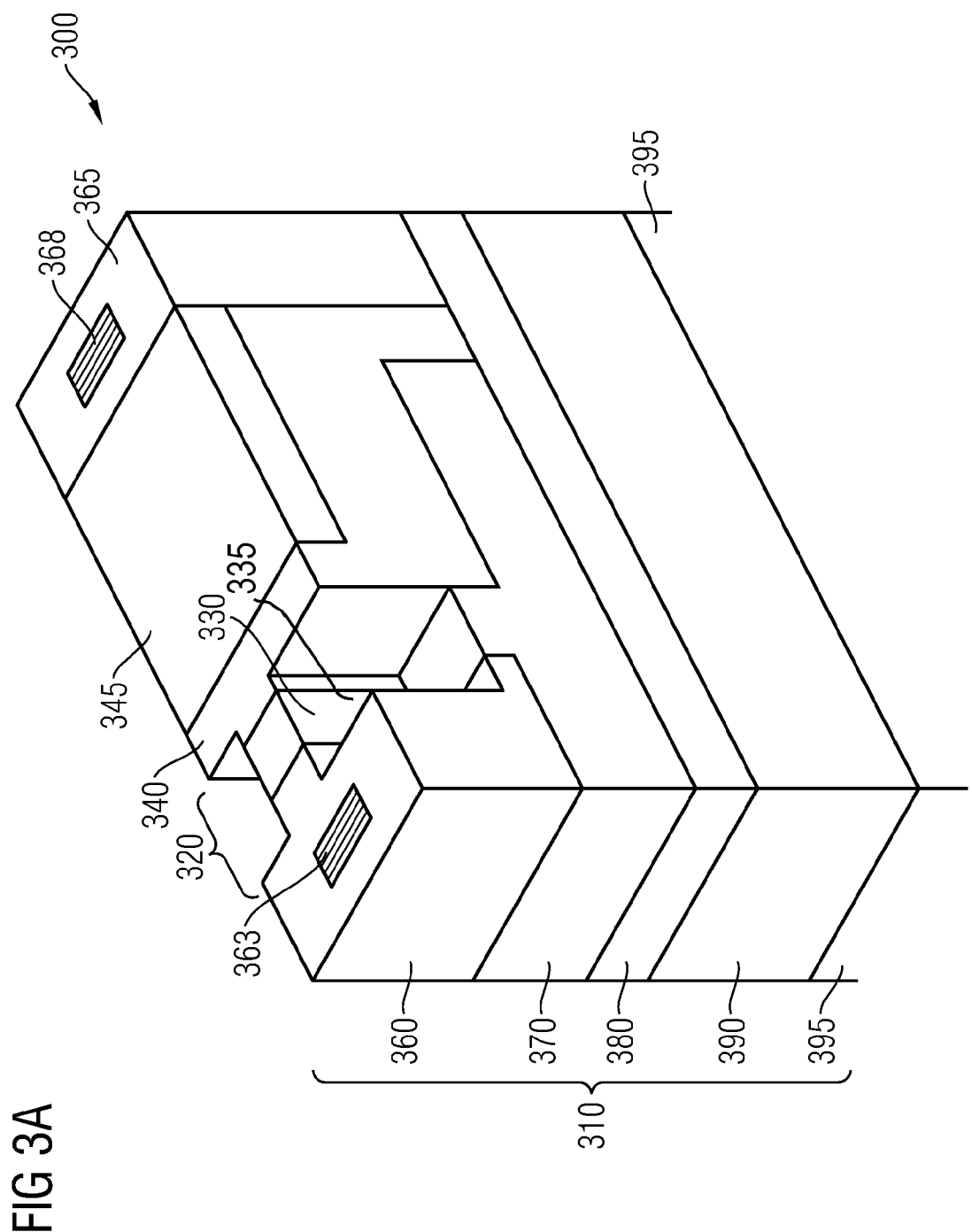
FIG. 3A illustrates one embodiment of a semiconductor device including a fin and a drain extension region, wherein the drain extension region is predominantly formed outside of the fin.

FIG. 3A illustrates a perspective view of a semiconductor device 300 according to another embodiment. In the semiconductor device 300 a drain extension region 340 is predominantly formed outside of a fin 320.

The semiconductor device 300 includes the fin 320 located at a first side of a semiconductor body 310. The semiconductor body 310 further includes a body region 330 of the second conductivity type, a channel region 335, a drain extension region 340 of the first conductivity type, and a shallow trench isolation 345 adjoining a top face of the drain extension region 340. Similar to the embodiment illustrated in FIG. 2A, a gate structure adjoins the fin 320 at two opposing walls of the fin 320 and optionally on the top face (not illustrated in FIG. 3A, see FIG. 2A). The semiconductor device 300 further includes a deep body region 370 of a second conductivity type, a bottom dielectric insulating the gate structure from the deep body region 370 (not illustrated in FIG. 3A, see FIG. 2A), a semiconductor layer 380 of the first or the second conductivity type, a highly doped buried layer 390 of the first or the second conductivity type, and a semiconductor substrate 395.

The buried layer 390 enables suppression or degradation of a vertical bipolar transistor injecting charge carriers into the semiconductor substrate 395. The buried layer 390 may have a higher doping concentration than the semiconductor layer 380. In one embodiment, the semiconductor substrate 395 is n-doped and the buried layer 390 is p$^+$-doped. In another embodiment, the semiconductor substrate 395 is p-doped and the buried layer 390 is n$^+$-doped. According to another embodiment, the semiconductor substrate 395 is part of a silicon-on-insulator (SOI) substrate. According to yet another embodiment, the semiconductor substrate 395 and the buried layer 390 are combined in a highly doped semiconductor substrate.

The arrangement of the shallow trench isolation 345 and the gate structure on the drain extension region 340 enables a higher doping in the drain extension region 340 due to a high electric field punch through. This enables a further reduction of the on-state resistance. The gate structure may also be absent on the top face of the fin 320.

At its two ends, the fin 320 adjoins a source region 360 of the first conductivity type and a drain region 365 of the first conductivity type. The source region 360 is electrically connected to a source contact 363, e.g. a highly doped polysilicon or metal source contact extending into the semiconductor body 310. The drain region 365 is electrically connected to a drain contact 368, e.g. a highly doped polysilicon or metal drain contact.

One or both of the source region 360 and the drain region 365 may extend as deep into the semiconductor body 310 as the drain extension region 340 or end in the deep body region 370.

One of the source and drain regions 360, 365 may also extend deeper into the semiconductor body 310. According to one embodiment, the one of the source and drain regions 360, 365 may end at a top face or extend into one of the semiconductor layer 380, the buried layer 390 and the semiconductor substrate 395.

Similar to the embodiment illustrated in FIGS. 2A to 2D, the drain contact 368 may extend through the drain region 365 and end at the semiconductor layer 380. An optional highly doped first contact layer sharing a conductivity type with the semiconductor layer 380 may be arranged between the semiconductor layer 380 and the drain contact 368 for reducing a contact resistance. Likewise, the source contact 363 may extend through the source region 360 and end at the deep body region 370. An optional highly doped second contact layer sharing a conductivity type with the deep body region 370 may be arranged between the deep body region 370 and the source contact 363 for reducing a contact resistance.

The deep body region 370 is electrically connected to the body region 330 and extends below the drain extension region 340 along a lateral direction. The deep body region 370 and the drain extension region 340 constitute a superjunction (SJ) structure. Charge compensation between the deep body region 370 and the drain extension region 340 enables a higher doping of the drain extension region 340 while maintaining the voltage blocking capabilities. Hence, the on-state resistance can be improved.

By forming the drain extension region 340 predominately outside of the fin 320 as illustrated in FIG. 3A, a cross sectional area of the drain extension region 340 is greater than a cross sectional area of the fin 320. This allows for a further reduction of the on-state resistance.

When viewed from the first side of the semiconductor body 310, the drain extension region 340, the deep body region 370, the semiconductor layer 380, the buried layer 390, and the semiconductor substrate 395 are successively arranged. Further regions may be located between any of the drain extension region 340, the deep body region 370, the semiconductor layer 380, the buried layer 390, and the semiconductor substrate 395.

Figure 3B:
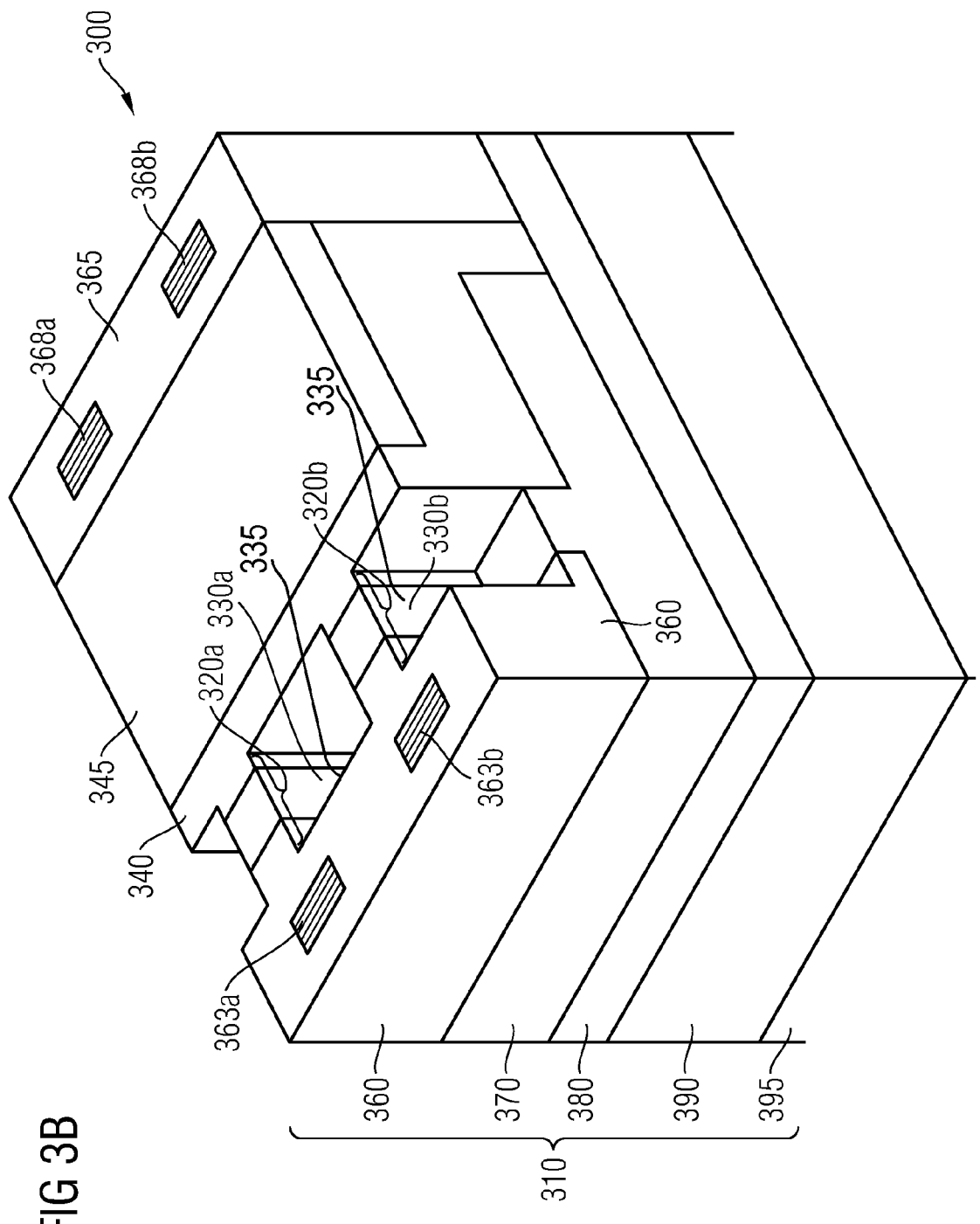
FIG. 3B illustrates a parallel connection of one embodiment of a semiconductor device including a parallel connection of transistor cells including a fin and a drain extension region, wherein the drain extension region is predominantly formed outside of the fin.

FIG. 3B illustrates one example of the semiconductor device 300 including a parallel connection of transistor cells having a fin and a drain extension region, wherein the drain extension region is predominantly formed outside of the fin. Whereas FIG. 3A illustrates one transistor cell, FIG. 3B is one example of a parallel connection of transistor cells. Each of fins 320a, 320b including body regions 330a, 330b is associated with one transistor cell. Although separate source contacts 363a, 363b and separate drain contacts 368a, 368b may be provided for each transistor cell as is illustrated in FIG. 3B, also a common source contact and a common drain contact may be provided for all or for a plurality of transistor cells.

As regards details of the illustrated elements of FIGS. 3A and 3B, e.g. materials and doping concentration of the body region 330, the drain extension region 340, the source region 360, the drain region 365, details related to the embodiments described with reference to FIGS. 1 and 2A to 2D apply likewise.

Figure 4:
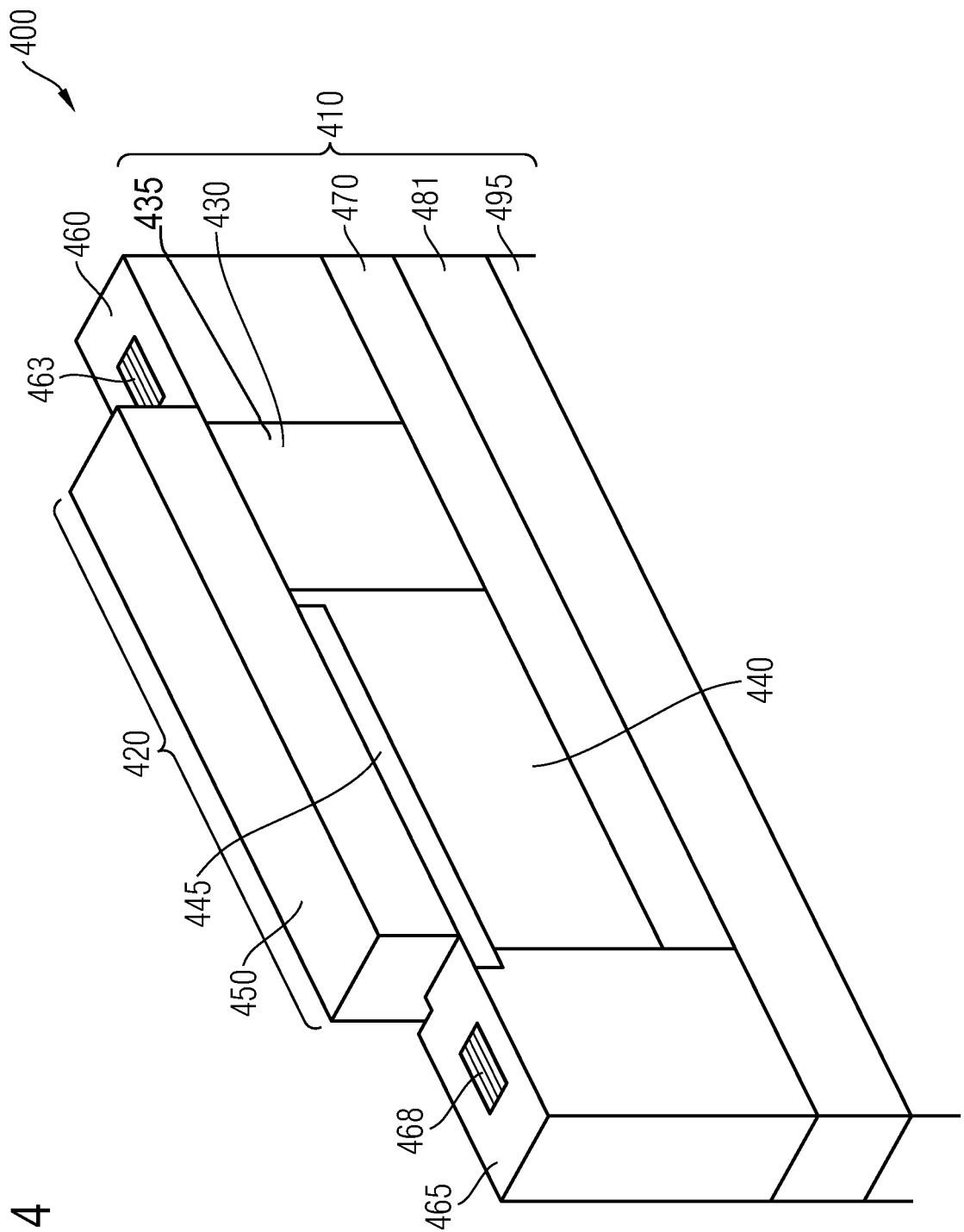
FIG. 4 illustrates one embodiment of a semiconductor device including a fin, a drain extension region and a buried dielectric.

FIG. 4 illustrates a semiconductor device 400 according to another embodiment. Similar to respective elements of the semiconductor device 200 illustrated in FIGS. 2A to 2D, the semiconductor device 400 includes a fin 420, a body region 430, a channel region 435, a drain extension region 440, a shallow trench isolation 445, a gate structure 450, a source region 460, a source contact 463, a drain region 465, a drain contact 468 and a deep body region 470. Other than the semiconductor device 200 illustrated in FIGS. 2A to 2D, the semiconductor device 400 includes a silicon-on-insulator (SOI) substrate. In other words, a buried dielectric 481, e.g. buried oxide replaces the semiconductor layer 280 and the buried layer 290 illustrated in FIGS. 2A to 2D. The buried dielectric 481 eliminates any parasitic vertical current flow from the semiconductor device 400 into a semiconductor substrate 495 below the buried dielectric 481.

Figure 5A:
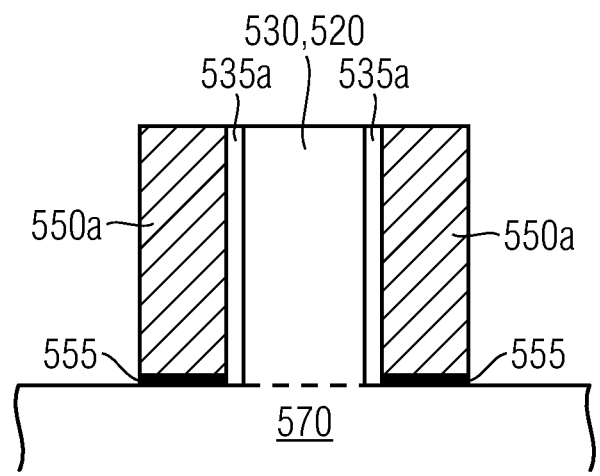
FIGS. 5A and 5B illustrate a gate structure and a channel region according to embodiments of a semiconductor device including a fin and a drain extension region.
Figure 5B:
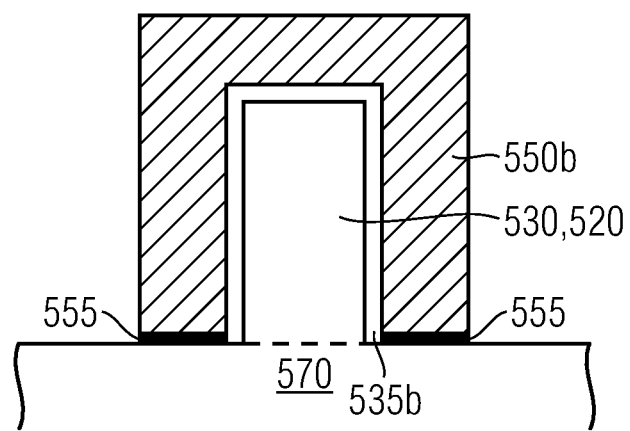

FIG. 5A and FIG. 5B illustrate examples having different layouts of a gate structure. Whereas a gate structure 550a including a gate dielectric and a gate electrode covers opposing walls of a fin 520 including a body region 530 in FIG. 5A, a gate structure 550b adjoins also a top face of the fin 520 in FIG. 5B. Channel regions 535a, 535b form part of the body region 530 and adjoin the respective gate structure 550a, 550b. In the channel regions 535a, 535b a charge carrier density can be controlled by field-effect. As an example, a voltage applied to the gate structure 550a, 550b may induce an inversion charge in the channel regions 535a, 535b, e.g. an n-conducting channel in a p-doped body region. Homogeneous doping in the body region 530 adjoining the gate structure 550a, 550b results in a homogenous current distribution over the channel regions 535a, 535b and thereby enlarges a current-carrying area of the channel regions 535a, 535b. In other words, homogeneous doping in the body region 530 adjoining the gate structures 550a, 550b results in a homogeneous threshold voltage along the channel regions 535a, 535b. One example of manufacturing a homogenous doping in the channel regions 535a, 535b is described with reference to FIG. 9.

In each of the examples illustrated in FIGS. 5A and 5B, a bottom dielectric 555 is of sufficient thickness to ensure a desired electric isolation between the gate structures 550a, 550b and a deep body region 570.

Figure 6:
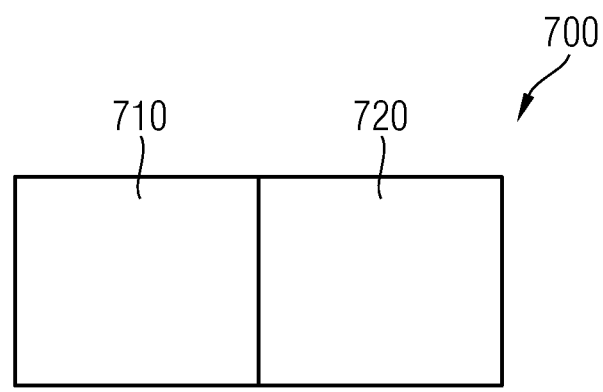
FIG. 6 illustrates one embodiment of an integrated circuit including a fin and a drain extension region.

FIG. 6 is a schematic illustration of an integrated circuit including a semiconductor device 700 with a fin and a drain extension region, e.g. a semiconductor device according to an embodiment described herein, in a first area 710 and other circuit elements in a second area 720, e.g. analog and/or digital circuit blocks. The other circuit elements may include one or more of a resistor, an inductor, a capacitor, a transistor, a diode and combinations thereof.

FIG. 7 illustrates a schematic process flow of a method of manufacturing a semiconductor device. Process feature S100 includes forming a fin at a first side of a semiconductor body. Process feature S110 includes forming a body region of a second conductivity type in at least a part of the fin. Process feature S120 includes forming a drain extension region of a first conductivity type. The drain extension region may also be formed before forming the fin, e.g. by epitaxial growth. Then the fin is formed in at least a part of the drain extension region and the body region is formed in at least a part of the fin, e.g. by implanting dopants into the fin. Process feature S130 includes forming a source and a drain region of the first conductivity type. Process feature S140 includes forming a gate structure adjoining opposing walls of the fin, wherein the body region and the drain extension region are arranged one after another between the source region and the drain region.

FIG. 8 is a schematic illustration of a process flow of a method of manufacturing a homogeneously doped channel region part of a body region. A homogenous dopant concentration in the channel region part counteracts inhomogeneous current flow along walls of the fin and thus maximizes a current-carrying area.

Process feature S200 includes implanting dopants at different implant energies into varying depths of a body region, e.g. through walls and/or a top face of the fin or through a surface of the semiconductor body. Implant energies E1 to En may result in Gaussian distributions of dopant concentrations centred at distances x1 to xn from the top face of the body region or semiconductor body.

Process feature S210 includes thermally diffusing the dopants by applying heat to the body region. Thereby, the Gaussian distributions of the dopant concentrations at distances x1 to xn expand and increasingly overlap with each other resulting in a homogenous doping concentration in the channel region of the body region.

Figure 9:
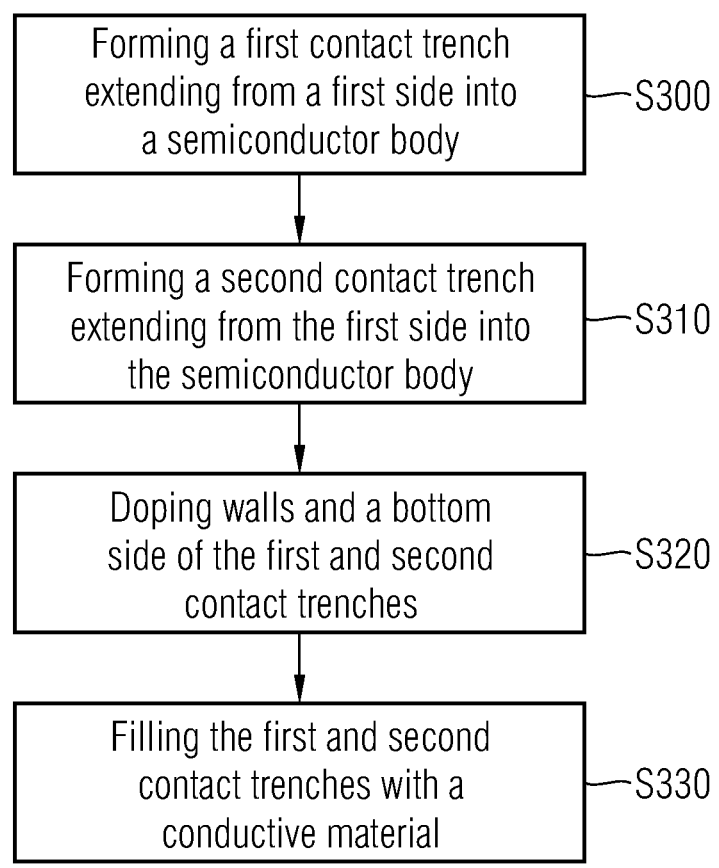
FIG. 9 illustrates one embodiment of a process flow of manufacturing a source and a drain region of a semiconductor device including a fin and a drain extension region.

FIG. 9 is a schematic illustration of a process flow of a method of manufacturing a source region and a drain region of the first conductivity type.

Process feature S300 includes forming a first contact trench extending from a first side into a semiconductor body.

Process feature S310 includes forming a second contact trench extending from the first side into the semiconductor body.

Process feature S320 includes doping walls and a bottom side of each one of the first and second contact trenches. In one embodiment, doping includes forming a doped silicate glass, e.g. phosphosilicate glass (PSG) for n-doping of silicon or borosilicate glass (BSG) for p-doping of silicon at the walls and at the bottom side of each one of the contact trenches, and thermally diffusing dopants of the doped silicate glass through the walls and through the bottom side of each one of the contact trenches by applying heat to the doped silicate glass, and, thereafter, removing the doped silicate glass. In another embodiment, the doping includes tilted implanting of the dopants through the sidewalls of the contact trenches.

Process feature S330 includes filling the first and second contact trenches with a conductive material, e.g. highly doped polysilicon and/or metal, thereby providing an electrical contact to the source and drain regions.

FIGS. 10A to 10E illustrate schematic cross-sectional and perspective views of a semiconductor substrate 1195 at different states during manufacture of a semiconductor device according to an embodiment.

Figure 10A:
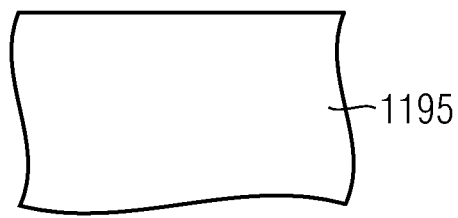

The semiconductor substrate 1195 is illustrated in FIG. 10A. In one embodiment, the semiconductor substrate includes one of a p-doped semiconductor layer on an n-doped semiconductor substrate, an n-doped semiconductor layer on a p-doped semiconductor substrate, and a silicon-on-insulator substrate, a highly doped semiconductor substrate.

Figure 10B:
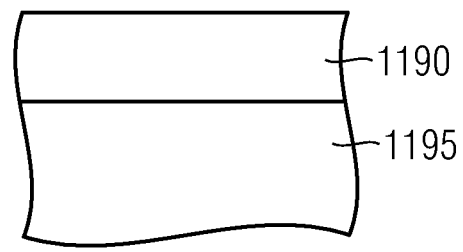

Referring to the schematic cross-sectional view of the semiconductor substrate 1195 in FIG. 10B, a buried layer 1190 of the first conductivity type is formed at a first side of the semiconductor substrate 1195. The buried layer 1190 may be formed by implanting dopants of the first conductivity type or by diffusing them into the semiconductor substrate 1195. The buried layer 1190 may also be formed by layer deposition, e.g. epitaxial growth.

Figure 10C:
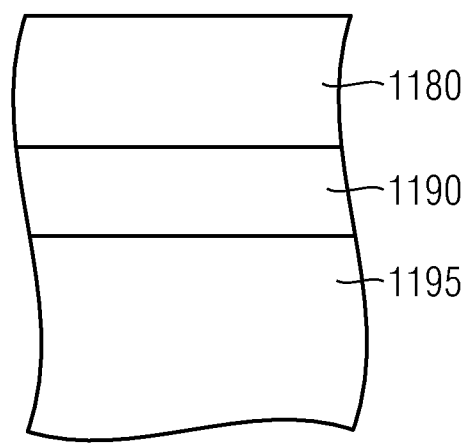

Referring to the schematic cross-sectional view of the semiconductor substrate 1195 in FIG. 10C, a layer 1180 of the first or the second conductivity type with a doping concentration lower than the concentration of the buried layer 1190 is formed on the buried layer 1190, e.g. by layer deposition such as epitaxial growth. In one embodiment, a doping concentration of the buried layer 1190 is at least $10^{17}$ cm$^{-3}$ and the doping concentration of the epitaxially grown layer 1180 is less than $10^{18}$ cm$^{-3}$.

Figure 10D:
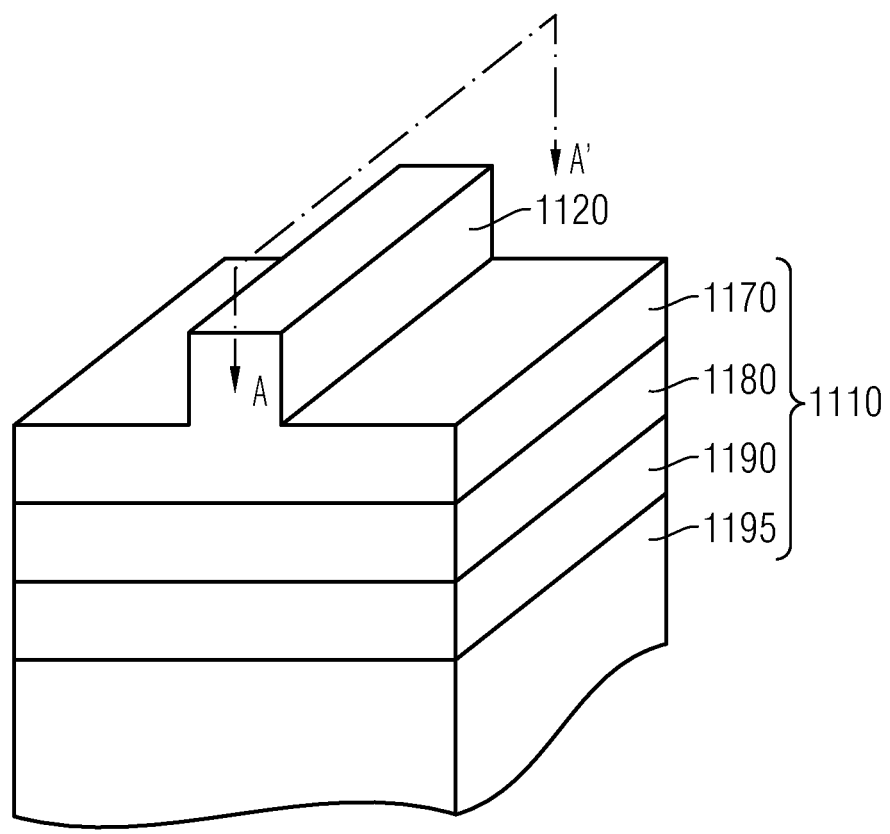

Further processing including forming a body region 1130, forming a deep body region 1170 and forming a fin 1120 including the body region 1130 result in a structure as illustrated in the perspective view of FIG. 10D. A semiconductor body 1110 includes a stack of the semiconductor substrate 1195, the buried layer 1190, the layer 1180 and the deep body region 1170.

Referring to the schematic cross-sectional view of FIG. 10E illustrating a cross-section along line AA' of FIG. 10D, a shallow trench isolation 1145 is formed at a top side of the fin 1120. The shallow trench isolation 1145 may be formed by etching a shallow trench into the fin 1120 and by filling the trench with an insulating material, e.g. SiO$_2$. The body region 1130 is electrically connected to the deep body region 1170 and adjoins a drain extension region 1140. The body region 1130 and/or the drain extension region 1140 may be formed by multiple masked implantations. The drain extension region 1140 may also be part of the layer 1180. The drain extension region 1140 may be formed in at least a part of the fin 1120 and a lateral extension of the drain extension region 1140 may range between 0.5 µm and 100 µm. An end of the drain extension region 1140 may be aligned with an end of the shallow trench isolation 1145 and an end of the deep body region 1170. In one embodiment the doping concentration of the body region 1130 ranges between $10^{16}$ cm$^{-3}$ and $10^{18}$ cm$^{-3}$ and the doping concentration of the drain extension region 1140 is less than $10^{18}$ cm$^{-3}$.

A source region 1160 of the first conductivity type and a drain region 1165 of the first conductivity type are formed in the semiconductor body 1110, e.g. by etching a trench into the semiconductor body 1110 and diffusing dopants from a diffusion source at walls and at a bottom side of the trench into the semiconductor body. The diffusion source may be removed after formation of the source and drain regions 1160, 1165. A source contact 1163, e.g. highly doped polysilicon or metal and a drain contact 1168, e.g. highly doped polysilicon or metal are filled in the trenches extending into the source region 1160 and into the drain region 1165. One of the trenches may extend through the source region 1160 or the drain region 1165 up to or into one of the deep body region 1170, the layer 1180, or the buried layer 1190. A gate structure 1150 is formed on a top face of the fin 1120.

In one embodiment the source and drain regions 1160, 1165 are formed as described in the process-flow S300 to S330 illustrated in FIG. 9 and a doping concentration of the source and drain regions 1160, 1165 exceeds at least $10^{19}$ cm$^{-3}$. The source region 1160 may adjoin the body region 1130 and the drain region 1165 may adjoin the drain extension region 1140.

Instead of covering the top face of the fin 1120, the gate structure 1150 may also cover only opposing sidewalls of the fin 1120 or cover opposing sidewalls and the top face of the fin 1120. The gate structure 1150 includes a conductive material or a combination of conductive materials, e.g. metal and/or a highly doped semiconductor material such as highly doped polysilicon and a gate dielectric. In case that the gate structure 1150 covers sidewalls of the fin 1120 a bottom dielectric insulates the gate structure 1150 from the deep body region 1170.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
   a fin at a first side of a semiconductor body;
   a body region of a second conductivity type in at least a part of the fin;
   a drain extension region of a first conductivity type;
   a source region and a drain region of the first conductivity type;
   a source contact in contact with the source region; and
   a gate structure adjoining opposing walls of the fin,
   wherein the body region and the drain extension region are arranged one after another between the source region and the drain region, the drain extension region having a larger width than the body region, the width being measured perpendicularly with respect to a direction between the source region and the drain region.

2. The semiconductor device of claim 1, wherein the source contact vertically extends to a bottom side of the source region.

3. The semiconductor device of claim 1, further comprising a deep body region of the second conductivity type below the source region, wherein the source contact contacts the deep body region.

4. The semiconductor device of claim 1, wherein the fin includes at least part of the drain extension region.

5. The semiconductor device of claim 1, further comprising a shallow trench isolation at a top face of the fin adjoining the drain extension region.

6. The semiconductor device of claim 1, wherein the gate structure adjoins a top face of the fin.

7. The semiconductor device of claim 1, wherein the deep body region is electrically connected to the body region.

8. The semiconductor device of claim 1, further comprising a drain contact in contact with the drain region, the drain contact extending along a vertical direction along the drain region.

9. An integrated circuit comprising the semiconductor device of claim 1.

10. A semiconductor device, comprising:
    a fin at a first side of a semiconductor body;
    a body region of a second conductivity type in at least a part of the fin;
    a drain extension region of a first conductivity type, a part of the drain extension region being disposed outside the fin;
    a source region and a drain region of the first conductivity type;
    a drain contact in contact with the drain region; and
    a gate structure adjoining opposing walls of the fin,
    wherein the body region and the drain extension region are arranged one after another between the source region and the drain region.

11. The semiconductor device of claim 10, wherein the drain contact vertically extends to a bottom side of the drain region.

12. The semiconductor device of claim 10, further comprising a doped layer beneath the drain region, wherein the drain contact contacts the doped layer.

13. The semiconductor device of claim 10, wherein the fin includes at least part of the drain extension region.

14. The semiconductor device of claim 10, wherein the gate structure adjoins the top face of the fin.

15. An integrated circuit comprising the semiconductor device of claim 10.

16. A method of manufacturing a semiconductor device, the method comprising:
    forming a fin at a first side of a semiconductor body;
    forming a body region of a second conductivity type in at least a part of the fin;
    forming a drain extension region of a first conductivity type;
    forming a source region and a drain region of the first conductivity type and
    forming a gate structure adjoining opposing walls of the fin,
    wherein the body region and the drain extension region are arranged one after another between the source region and the drain region,
    wherein the drain extension region is formed so as to have a larger width than the body region, the width being measured perpendicularly with respect to a direction between the source region and the drain region.

17. The method according to claim 16, wherein forming the source region comprises diffusing dopants from a diffusion source at walls into the semiconductor body.

* * * * *